(12) United States Patent
Ali (10) Patent No.: US 7,573,714 B2
(45) Date of Patent: Aug. 11, 2009

(54) METHOD AND APPARATUS FOR DISSIPATING HEAT IN A COMPUTER SYSTEM

(75) Inventor: Ihab Ali, San Jose, CA (US)

(73) Assignee: Apple Inc., Cupertino, CA (US)

( * ) Notice: Subject to any disclaimer, the term of this patent is extended or adjusted under 35 U.S.C. 154(b) by 68 days.

(21) Appl. No.: 11/624,336

(22) Filed: Jan. 18, 2007

(65) Prior Publication Data

US 2008/0043428 A1 Feb. 21, 2008

Related U.S. Application Data

(63) Continuation of application No. 10/951,953, filed on Sep. 28, 2004, now Pat. No. 7,190,577.

(51) Int. Cl.
*H05K 7/20* (2006.01)
(52) U.S. Cl. ............... 361/700; 361/688; 361/689; 361/690; 361/697; 257/715; 174/15.2; 174/16.1; 174/16.3; 165/80.3; 165/80.4; 165/104.26
(58) Field of Classification Search .............. None
See application file for complete search history.

(56) References Cited

U.S. PATENT DOCUMENTS

| | | | | |
|---|---|---|---|---|
| 5,581,443 | A | * | 12/1996 | Nakamura et al. ......... 361/705 |
| 5,712,762 | A | * | 1/1998 | Webb .................. 361/687 |
| 5,969,940 | A | * | 10/1999 | Sano et al. ............ 361/687 |
| 5,973,920 | A | * | 10/1999 | Altic et al. ............ 361/687 |
| 6,019,165 | A | | 2/2000 | Batchelder |
| 6,058,012 | A | | 5/2000 | Cooper et al. |
| 6,073,684 | A | * | 6/2000 | Fiechter et al. ........ 165/104.33 |
| 6,088,223 | A | * | 7/2000 | Diemunsch ............ 361/690 |
| 6,175,493 | B1 | | 1/2001 | Gold |
| 6,241,007 | B1 | * | 6/2001 | Kitahara et al. ......... 165/80.4 |
| 6,400,565 | B1 | | 6/2002 | Shabbir et al. |
| 6,421,239 | B1 | * | 7/2002 | Huang ................ 361/696 |
| 6,621,698 | B2 | * | 9/2003 | Chang ................ 361/687 |
| 6,646,874 | B2 | * | 11/2003 | Pokharna et al. ........ 361/687 |
| 6,650,540 | B2 | * | 11/2003 | Ishikawa .............. 361/695 |
| 6,725,906 | B2 | * | 4/2004 | Lin et al. ............. 361/695 |
| 6,863,117 | B2 | | 3/2005 | Valenzuela |
| 6,900,984 | B2 | * | 5/2005 | Merz et al. ............ 361/687 |
| 6,937,474 | B2 | * | 8/2005 | Lee .................. 361/715 |
| 7,019,967 | B2 | * | 3/2006 | DiFonzo et al. ......... 361/687 |
| 7,130,193 | B2 | * | 10/2006 | Hirafuji et al. ......... 361/700 |
| 7,447,030 | B2 | * | 11/2008 | Hwang et al. .......... 361/700 |
| 2002/0053421 | A1 | * | 5/2002 | Hisano et al. ......... 165/104.33 |
| 2008/0043436 | A1 | * | 2/2008 | Hung et al. ........... 361/700 |

\* cited by examiner

*Primary Examiner*—Boris L Chervinsky
(74) *Attorney, Agent, or Firm*—Sawyer Law Group P.C.

(57) ABSTRACT

A cooling system for a computer is provided. In one implementation, the cooling system includes a heat spreader that is in thermal contact with a heat generating component in the computer, a frame casting, and a heat pipe to passively dissipate heat generated from the heat generating component to the frame casting. The heat pipe includes a first portion that is co-planar with and in direct contact with the heat generating component, and a second portion that is in thermal contact with the frame casting.

14 Claims, 10 Drawing Sheets

METHOD AND APPARATUS FOR DISSIPATING HEAT IN A COMPUTER SYSTEM

CROSS-REFERENCE TO RELATED APPLICATIONS

This application is a continuation of under 35 U.S.C. 120 of Ser. No. 10/951,953 now U.S. Pat. No. 7,190,577, filed Sep. 28, 2004, the entire contents of which are incorporated by reference herein.

FIELD OF THE INVENTION

The present invention relates to a cooling system for a computer system, and more particularly to a cooling system with integrated passive and active cooling mechanisms that allow for multiple levels of cooling.

BACKGROUND OF THE INVENTION

As computer components evolve into more powerful devices, their power requirements consequently increase. With this increase in power consumption, a commensurate increase in power dissipation in the form of heat results. For example, in a laptop computer system, microprocessors, such as a central processing unit (CPU) and a graphical processing unit (GPU), and a chipset are major sources of heat.

Heat dissipation is an important consideration in the design of modern-day computer systems. If heat is not adequately dissipated from the system, components may fail causing catastrophic damage to the system. To date, cooling systems have utilized finned heat sinks, augmented by axial flow fans mounted on the heat sink and/or air movers in the form of fans within or around the computer system. Nevertheless, as the amount of heat generated by the components increases, the current cooling systems will prove inadequate because larger heat sinks and/or fans will not fit into the already cramped space in and around a computer system.

BRIEF SUMMARY OF THE INVENTION

In general, in one aspect, this specification describes a cooling system for a computer. The cooling system includes a heat spreader that is in thermal contact with a heat generating component in the computer, a frame casting, and a heat pipe to passively dissipate heat generated from the heat generating component in the computer to the frame casting. The heat pipe includes a first portion that is co-planar with and in direct contact with the heat generating component, and a second portion that is in thermal contact with the frame casting.

Particular implementations can include one or more of the following features. Conductive and convective heat transfer characteristics of the frame casting can be utilized to provide additional passive cooling for the heat generating component. One or more ancillary heat pipes can be embedded in the heat spreader, in which the one or more ancillary heat pipes make thermal contact with the heat generating component. The first portion of the heat pipe can be embedded in the heat spreader and the second portion of the heat pipe can extend from the heat spreader to the frame casting and be in thermal contact with the frame casting along a length of the frame casting. The first portion of the heat pipe can comprise an evaporative portion of the heat pipe. The second portion of the heat pipe can comprise a condensation portion of the heat pipe. Heat generated by the heat generating component can be transferred to coolant within the evaporative portion of the heat pipe to vaporize the coolant. The vaporized coolant can be cooled within the condensation portion of the heat pipe and transfer the heat generated by the heat generating component to the frame casting. The heat pipe can comprise a hollow core that contains the coolant, and a wicking layer surrounding the hollow core for transporting the vaporized coolant from the evaporative portion of the heat pipe to the condensation portion of the heat pipe. The heat pipe can further include a thermal conductive layer surrounding the wicking layer for transferring at least a portion of the heat generated by the heat generating component to the frame casting and the heat spreader.

Particular implementations can further include one or more of the following features. The heat generating component can comprise a central processing unit (CPU), a graphical processing unit (GPU), or a chipset. The cooling system can further include a radial fan in the computer for blowing air in the computer and exhausting the air from the computer through a vent in the frame casting. The second portion of the heat pipe can be disposed over the vent such that the air exhausted through the vent by the radial fan actively cools both the second portion of the heat pipe and the frame casting. The cooling system can further include a fin stack located at the vent in the frame casting, wherein the second portion of the heat pipe is also in thermal contact with the fin stack. A top surface of the heat spreader can include a plurality of channels for increasing surface area and improving the heat transfer rate between the heat spreader and the air in the computer. The plurality of channels can be formed on the top surface of the heat spreader such that each channel points to a center of the radial fan to direct air flow in the computer to the radial fan. A bottom surface of the heat spreader can include a thermal interface contact for each heat generating component in the computer to reduce thermal resistance between the heat spreader and each heat generating component.

In general, in another aspect this specification describes a cooling system for a computer including a heat spreader having a top surface and a bottom surface, in which the bottom surface of the heat spreader is in direct contact with a heat generating component in the computer and the top surface of the heat spreader includes a plurality of channels for increasing a surface area of the heat spreader and improving the heat transfer rate between the heat spreader and air in the computer. The cooling system further includes a radial fan in the computer for blowing the air in the computer and exhausting the air through a vent of the computer. The plurality of channels are formed on the top surface of the heat spreader such that each channel points to a center of the radial fan to reduce resistance of air flow in the computer to the radial fan.

Particular implementations can include one or more of the following features. The cooling system can further include a frame casting, and a heat pipe coupled to the heat spreader and coupled to the frame casting for passively dissipating heat generated from the heat generating component in the computer to the frame casting. The heat pipe can include a first portion that is co-planar with and in direct contact with the heat generating component, and a second portion that is in thermal contact with the frame casting. The first portion of the heat pipe can be embedded in the heat spreader and the second portion of the heat pipe can extend from the heat spreader to the frame casting and be in thermal contact with the frame casting along a length of the frame casting.

According to the cooling system disclosed, the conductive and convective heat transfer characteristics of the frame casting are utilized to significantly improve heat dissipation. Passive and active cooling mechanisms are integrated into the cooling system and, depending on the temperature of the computer system at any given time, one mechanism or both can be utilized. Thus, the cooling system offers multiple levels of cooling capacity.

The details of one or more implementations are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF THE INVENTION

The present disclosure relates to a cooling system for a computer system, and more particularly to a cooling system with integrated passive and active cooling mechanisms that allow for multiple levels of cooling. The following description is presented to enable one of ordinary skill in the art to make and use the invention and is provided in the context of a patent application and its requirements. The present invention is not intended to be limited to the implementations shown, but is to be accorded the widest scope consistent with the principles and features described herein.

According to one implementation, a heat spreader is disclosed that is in thermal contact with heat generating components in a computer system for transferring thermal energy from the heat generating components to at least one heat pipe. Each heat pipe is embedded in the heat spreader at one end and is coupled to a frame casting of the computer system at an end opposite to the end embedded in the heat spreader. The heat pipe transfers waste heat from the components to the frame casting such that the superior conductive and convective heat transfer characteristics of the frame casting can be utilized to cool the components. Thus, by exploiting the heat dissipation characteristics of the heat spreader, the at least one heat pipe, and the computer's frame casting, the components in the computer system are cooled efficiently and effectively.

Figure 1:
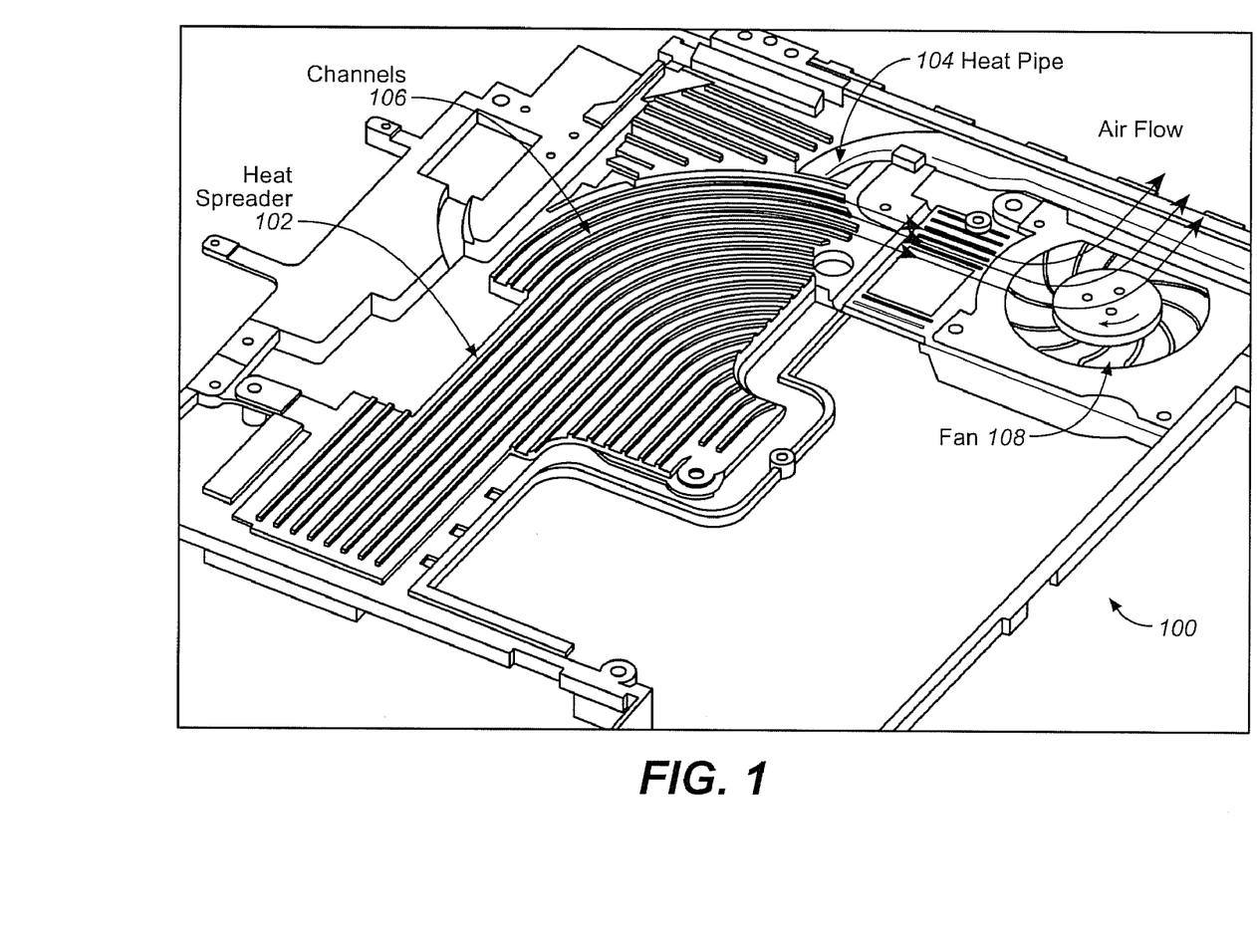
FIG. 1 is a front top perspective view of a cooling system according to one implementation.
Figure 2:
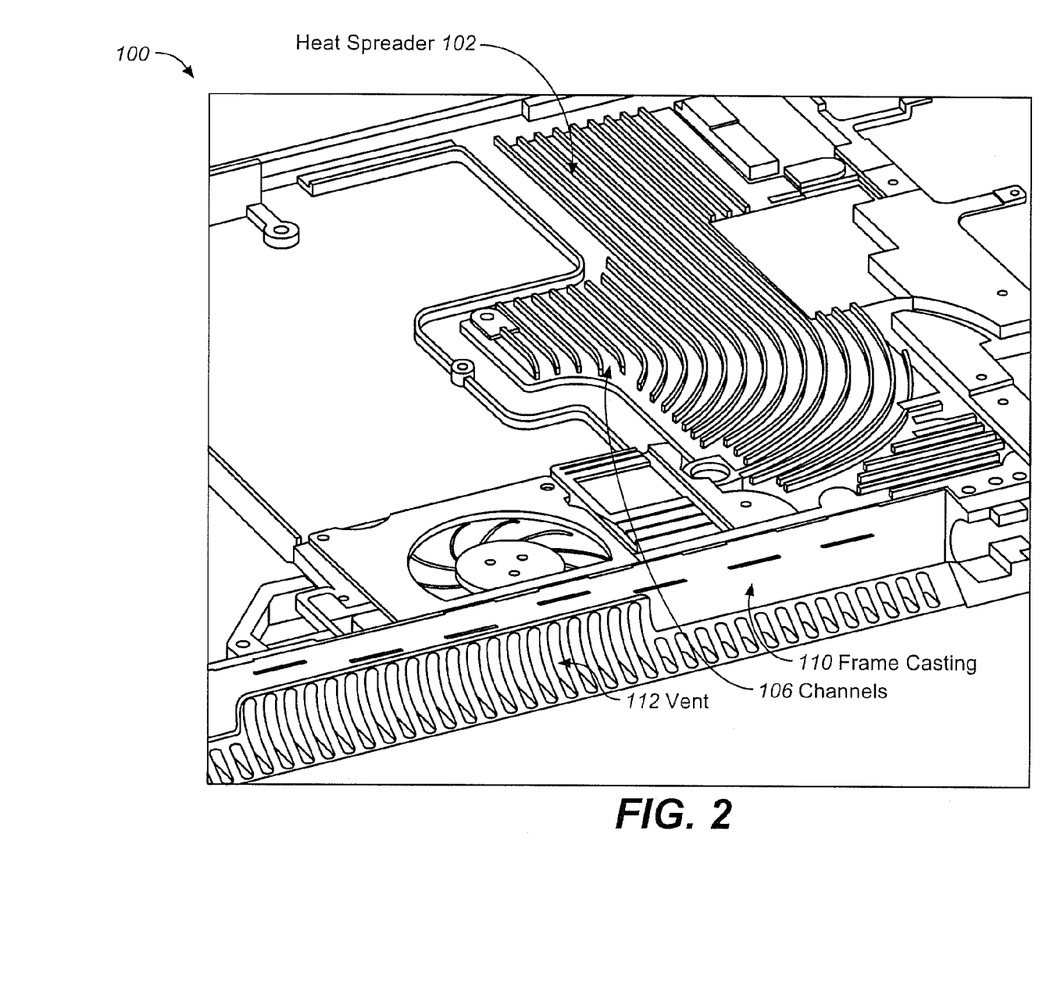
FIG. 2 is a top back perspective view of the cooling system according to one implementation.

FIG. 1, FIG. 2 and FIGS. 3A and 3B are front top, back top and back bottom views, respectively, of the cooling system according to one implementation. Similar elements are identified by the same item numerals. Referring to FIGS. 1, 2, 3A, and 3B the cooling system 100 includes a heat spreader 102 (FIG. 1, FIG. 2) and a frame casting 110 (FIG. 2). The heat spreader 102 and the frame casting 110 are thermally connected by a heat pipe 104 that is embedded in the heat spreader 102 (FIG. 1, FIG. 3B) at one end and integrated with the frame casting 110 at the other end. Although only one heat pipe 104 is shown, multiple heat pipes 104 can utilized if and/or when feasible.

Figure 3A:
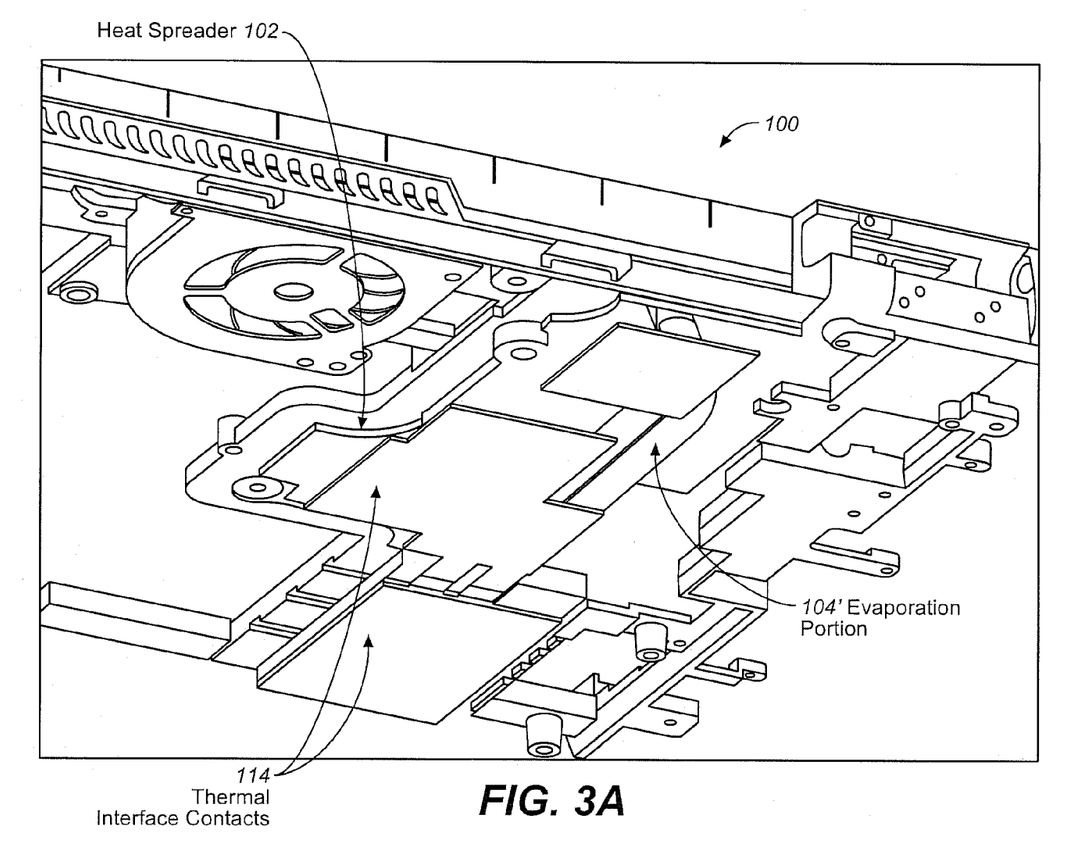
FIG. 3A is a bottom back perspective view of the cooling according to one implementation.
Figure 9:
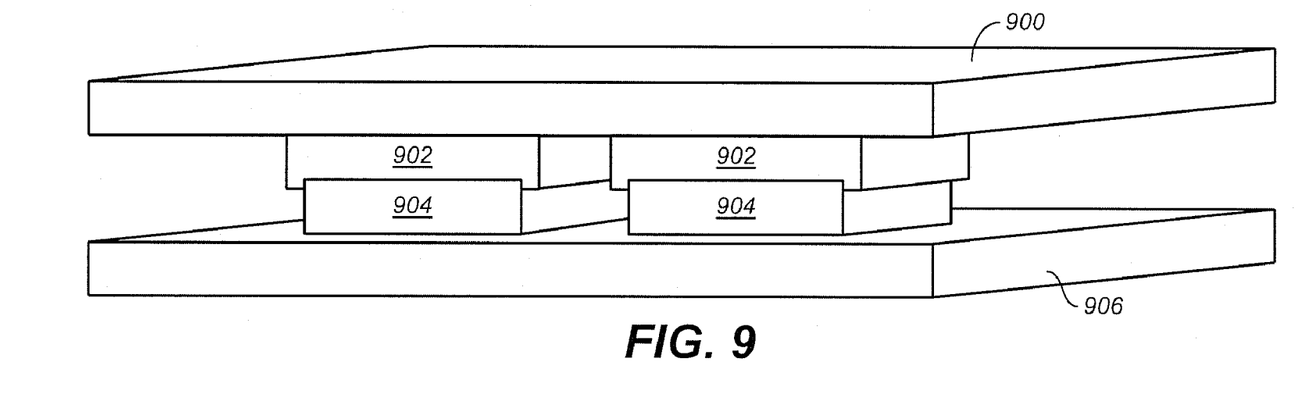
FIG. 9 illustrates a heat spreader in contact with a heat generating component according to one embodiment of the invention.

In general, heat generating components are coupled to a motherboard (not shown) and the heat spreader 102 is preferably positioned above the motherboard. As is shown in FIG. 3A, a bottom surface of the heat spreader 102 includes a plurality of thermal interface contacts 114 that are in direct contact with the heat generating components (not shown) in the computer system. The thermal interface contacts 114 minimize thermal resistance between the heat spreader 102 and the components, as is well known to those skilled in the art. Accordingly, heat generated by the components is transferred directly to the heat spreader 102, where the heat is dissipated into the ambient air in the computer. For example, FIG. 9 illustrates a cross-sectional view of a portion of a heat spreader 900 having a plurality of thermal interface contacts 902 that are respectively in direct contact with heat generating components 904. The heat generating components 904 are coupled to a motherboard 906. As discussed above, the heat generating components 904 can include components such as a central processing unit (CPU), a graphical processing unit (GPU), or a chipset.

To further improve heat dissipation, one or more ancillary heat pipes 124 (FIG. 3A and FIG. 3B) are embedded into the heat spreader 102. As is shown in FIG. 3A, the ancillary heat pipe 124 makes direct contact with each of the thermal interface contacts 114, and facilitates the transfer of energy to the heat spreader 102, as well as to ambient air.

In one implementation, a top surface of the heat spreader 102 includes a plurality of channels 106 (FIG. 1) that increase the heat transfer rate between the heat spreader 102 and the ambient air in the computer. In one implementation, the channels 106 are formed in such a manner that each channel "points" or leads to a center of a radial fan 108. When the fan 108 is in operation, the channels 106 help direct waste air to the fan 108 where it is exhausted out of the computer. Thus, the channels 106 improve air circulation through the computer by reducing airflow resistance thereby improving overall heat dissipation.

Figure 3B:
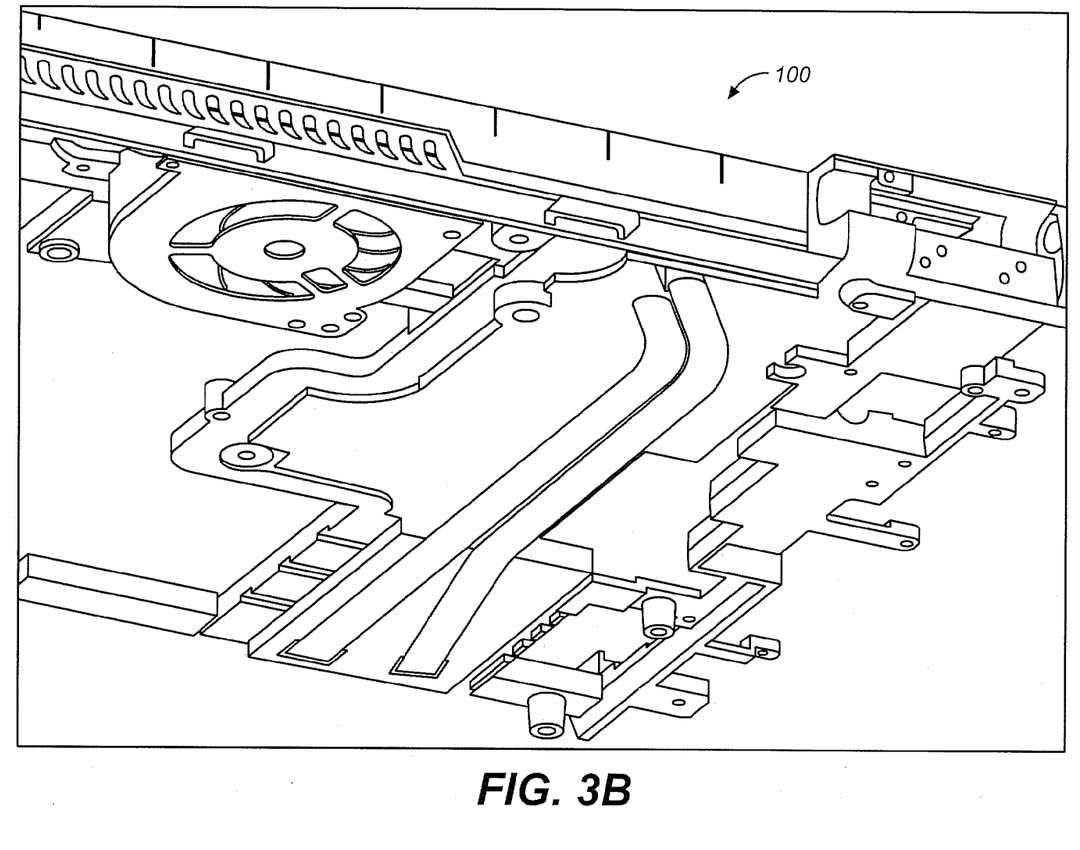
FIG. 3B is a bottom back perspective view of the cooling system showing the heat pipe and ancillary heat pipe according to one implementation.
Figure 4:
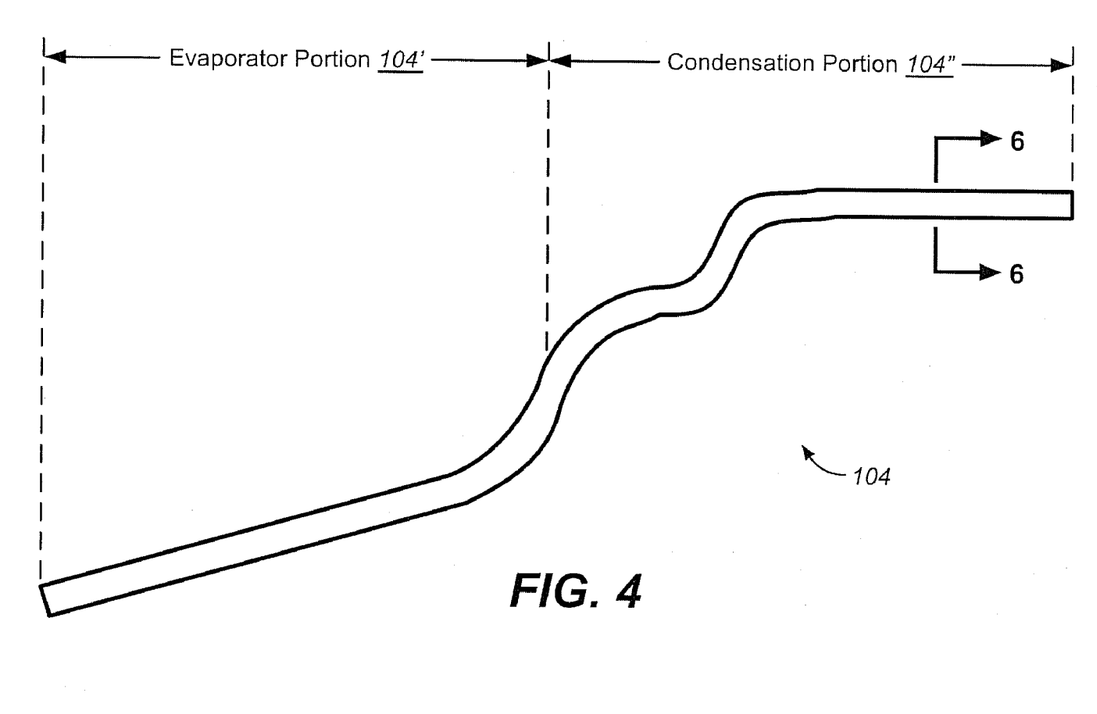
FIG. 4 is a perspective view of the heat pipe according to one implementation.

As stated above, the heat pipe 104 thermally connects the heat spreader 102 to the frame casting 110 so that the frame casting 110 can be utilized as an additional source for passively cooling the components. FIG. 4 is a perspective view of the heat pipe 104 according to one implementation. Referring to FIG. 3B and FIG. 4, according to one implementation, a first portion of the heat pipe, referred to as an evaporation portion 104', is embedded in the heat spreader 102 (FIG. 3B). The first portion of the heat pipe 104' is considered an evaporation section of the heat pipe 104 because here, the heat generated by the components is transferred to a coolant inside the heat pipe 104, which evaporates the coolant.

As shown in FIG. 3A and FIG. 3B, the evaporation portion of the heat pipe 104' makes direct contact with each of the thermal interface contacts 114. The bottom surface of the heat spreader 102 and the contact surface of the evaporation portion of the heat pipe 104' are preferably press fit or fly cut to ensure that the evaporation portion of the heat pipe 104' is co-planar with and in direct contact with the heat generating components thereby further decreasing thermal resistance.

Referring again to FIG. 4, the heat pipe 104 also includes a second portion, referred to as a condensation portion 104", which is in thermal contact with the frame casting 110. Referring again to FIG. 1, the condensation portion of the heat pipe 104" extends from the heat spreader 102 to the frame casting 110 to form a thermal path between the heat spreader 102 and the frame casting 110. The condensation portion of the heat pipe 104" is referred to as a condensation segment because here, the vaporized coolant cools, i.e., transfers its thermal energy to the frame casting 110, and the coolant transforms back to a liquid state.

Figure 5:
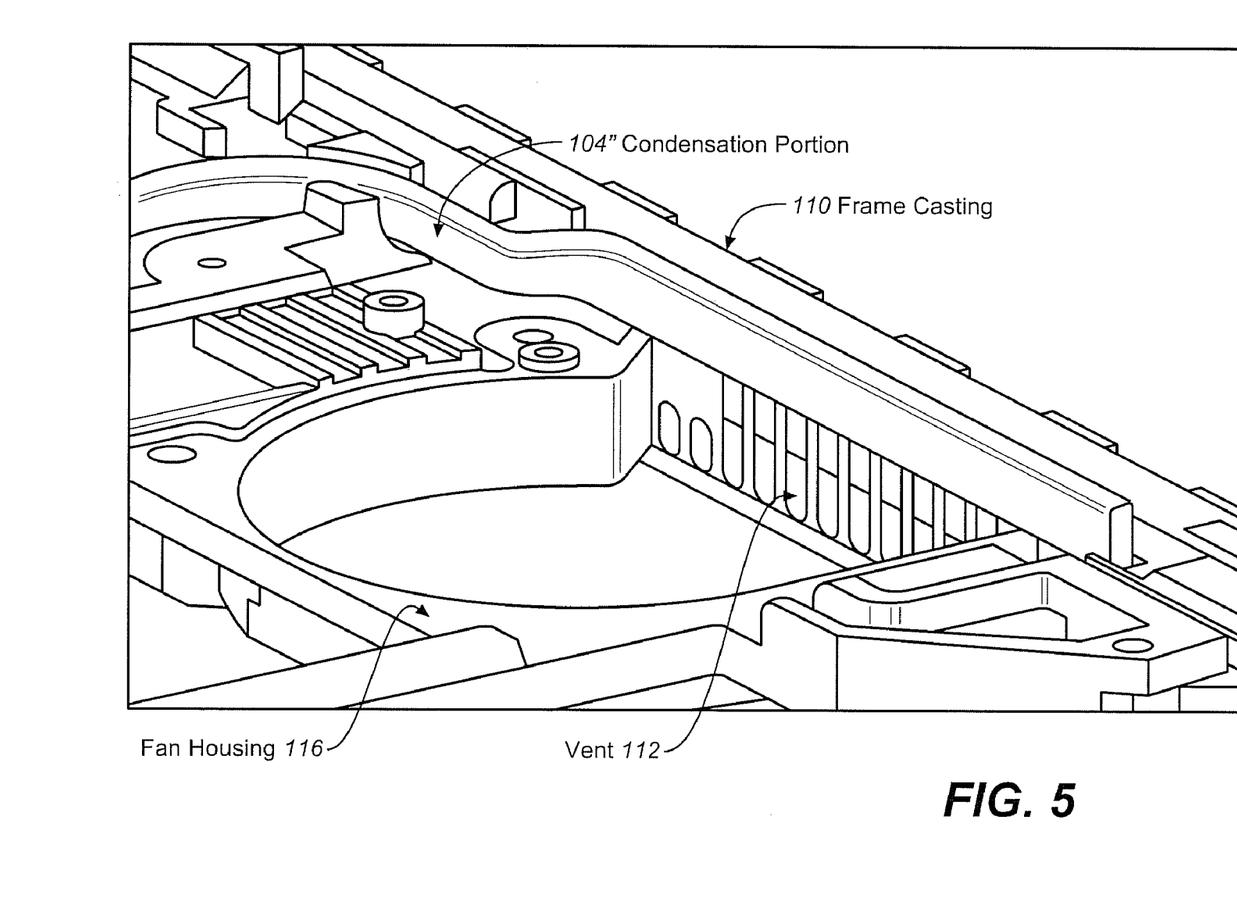
FIG. 5 is a view of the heat pipe, frame casting, and fan housing according to one implementation.

FIG. 5 is a view of the condensation portion of the heat pipe 104" in relation to the frame casting 110 according to one implementation. As is shown, the condensation portion 104" makes direct thermal contact with the frame casting 110 and maintains thermal contact with the frame casting 110 along the length of the frame casting 110. Moreover, the condensation portion 104" is flattened to form a rectangular cross-section where the longer side is in contact with the frame casting 110. Flattening the condensation portion 104" in this manner increases the surface area in contact with the frame casting 110 and therefore increases passive heat dissipation.

Figure 6:
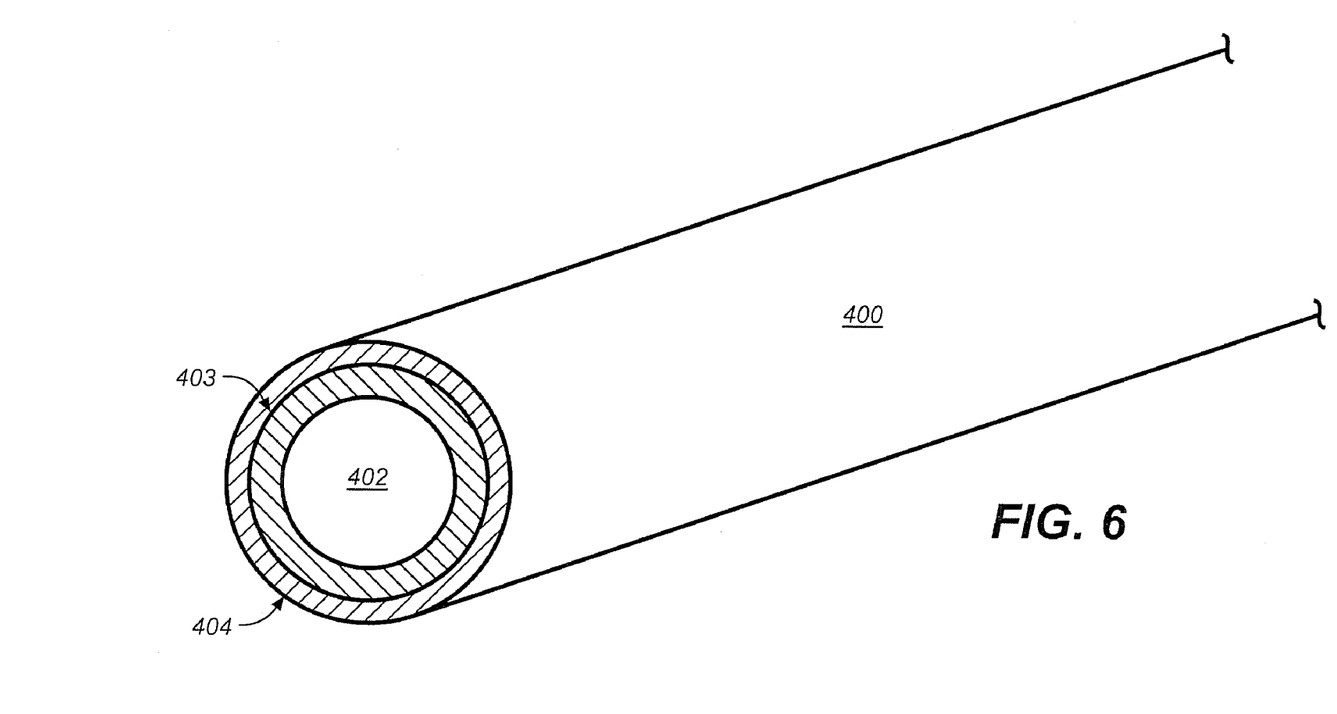
FIG. 6 is a cross-section of a heat pipe according to one implementation.

FIG. 6 is a cross-sectional view of the heat pipe taken along line A-A of FIG. 4. The heat pipe 400 includes a hollow core 402 that contains the coolant. The core 402 is surrounded by a wicking layer 403 for transporting condensed vapor from a cool region of the heat pipe 400 to a hot region of the heat pipe 400. The wicking layer 403 is then surrounded by a thermal conductor layer 404, such as copper or aluminum, for transferring thermal energy to a heat sink, e.g., the heat spreader 102 and the frame casting 110.

Referring again to FIG. 5, the frame casting 110 includes a vent 112 where air within the computer system is exhausted when a fan 108 (FIG. 1) is operating. In one implementation, the condensation portion 104" is positioned over a part of the vent 112 so that when air is exhausted by the fan 108, the exhausted air provides additional cooling to the heat pipe 104 and to the frame casting 110. This improves the overall cooling capacity of the system 100.

In one implementation, the condensation portion 104" is also in thermal contact with a fin stack that is disposed at the vent 112 location. The fin stack provides additional heat dissipation capacity.

Figure 7:
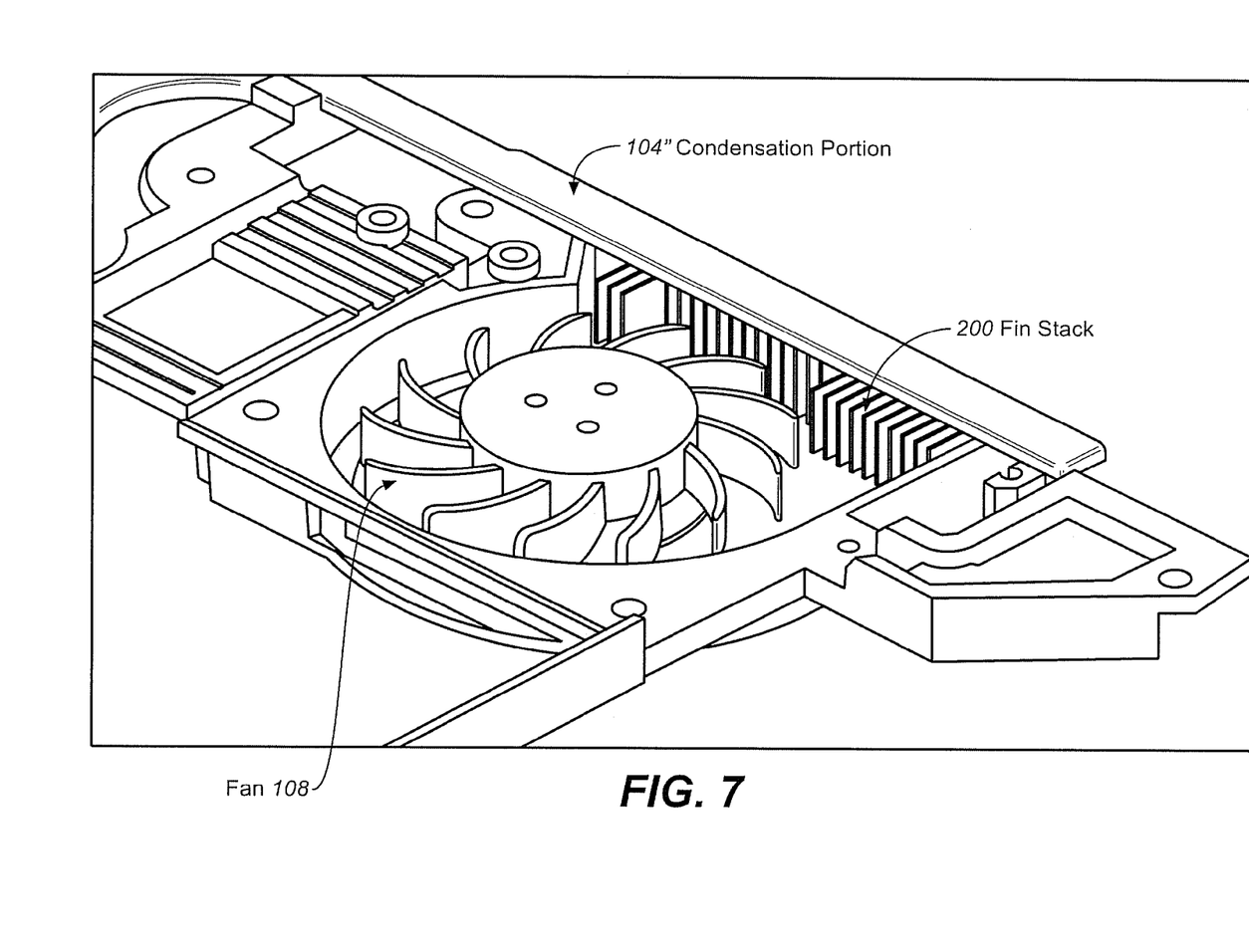
FIG. 7 is a front perspective view of the fan, heat pipe and fin stack according to one implementation.
Figure 8:
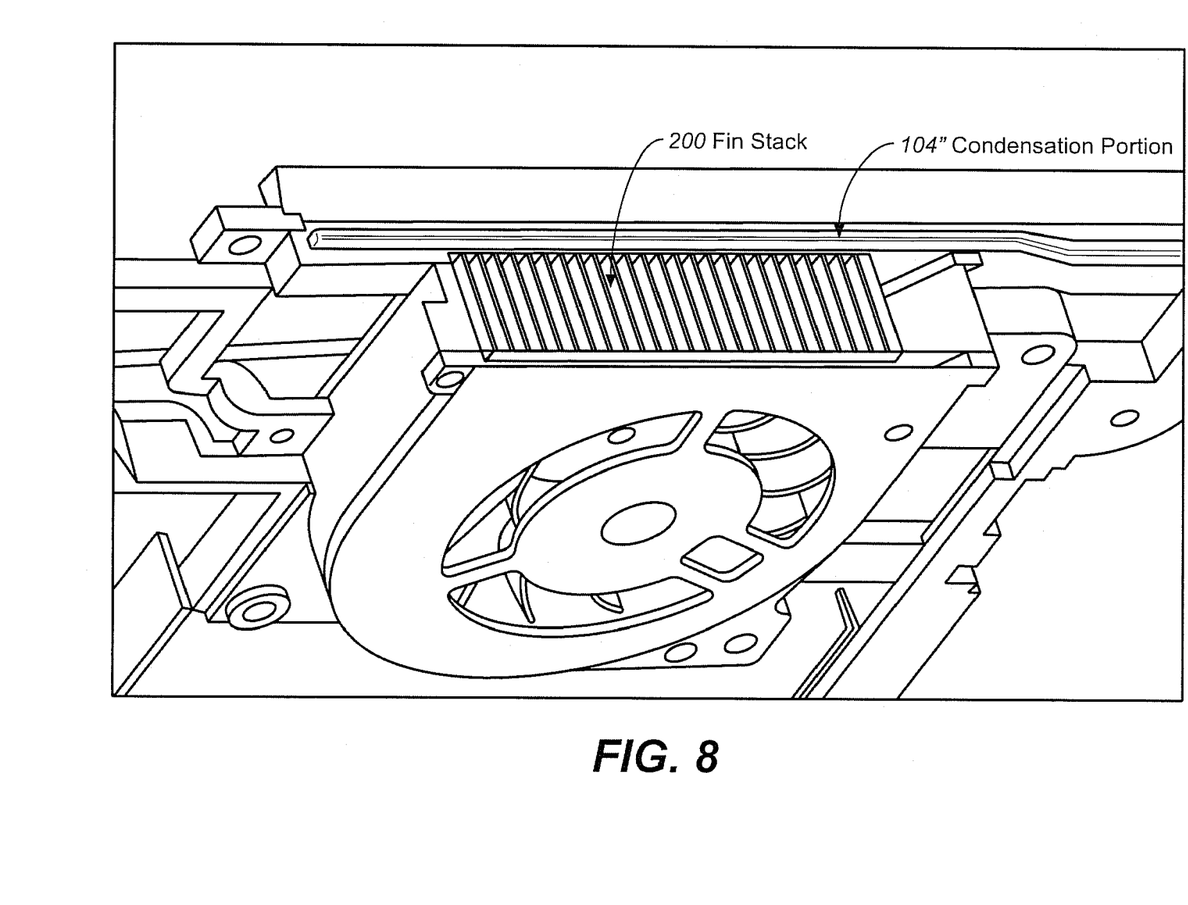
FIG. 8 is a back perspective view of the heat pipe and fin stack according to one implementation.

FIG. 7 is front perspective view of the fin stack in relation to the condensation portion 104" and fan, and FIG. 8 is a back perspective view of the fin stack in relation to the condensation portion 104". As is shown in FIGS. 7 and 8, the condensation portion 104" makes thermal contact with each fin in the fin stack 200. Accordingly, the fin stack 200 effectively increases the heat transfer rate between the condensation portion 104" and the ambient air. Because the fin stack 200 is located at the vent (not shown), the exhausted air actively cools the fin stack 200 when the fan 108 is operating, which further improves heat dissipation.

The cooling system described above, integrates passive and active cooling mechanisms to dissipate heat generated by the components in the computer. Depending on the temperature of the components, one or both mechanisms can be activated. The passive mechanisms, including the heat spreader 102 with its channels 106, the heat pipe 104, the frame casting 110, and the fin stack 200, in combination provide substantial cooling capacity. If further cooling is required, the fan 108 can be utilized to provide active cooling, which is enhanced by the features described relating to the heat spreader 102, the heat pipe 104, the frame casting 110 and the fin stack 200. Different fan speeds, e.g., low and high, can be designated to provide varying levels of cooling.

A system for dissipating heat generated by components in a computer has been disclosed. The present invention has been described in accordance with the implementations shown, and there could be variations to the implementations, and any variations would be within the scope of the present invention.

What is claimed is:

1. A cooling system for a computer comprising:
    a heat spreader that is in thermal contact with a heat generating component in the computer;
    a frame casting of the computer;
    a heat pipe to passively dissipate heat generated from the heat generating component in the computer to the frame casting, the heat pipe including,
        a first portion that is co-planar with and in direct contact with the heat generating component; and
        a second portion that is in thermal contact with the frame casting; and
    a radial fan to cool each of the heat pipe, the frame casting and the heat spreader by exhausting air from the computer through a vent in the frame casting, wherein the second portion of the heat pipe is disposed over the vent such that the air exhausted through the vent by the radial fan actively cools both the second portion of the heat pipe and the frame casting, and wherein a top surface of the heat spreader includes a plurality of channels pointing to a center of the radial fan to reduce resistance of air flow in the computer to the radial fan.

2. The cooling system of claim 1, wherein conductive and convective heat transfer characteristics of the frame casting are utilized to provide additional passive cooling for the heat generating component.

3. The cooling system of claim 1, further comprising one or more ancillary heat pipes embedded in the heat spreader, wherein the one or more ancillary heat pipes make thermal contact with the heat generating component.

4. The cooling system of claim 1, wherein the first portion of the heat pipe is embedded in the heat spreader and the second portion of the heat pipe extends from the heat spreader to the frame casting and is in thermal contact with the frame casting along a length of the frame casting.

5. The cooling system of claim 4, wherein:
    the first portion of the heat pipe comprises an evaporative portion of the heat pipe; and
    the second portion of the heat pipe comprises a condensation portion of the heat pipe,
    wherein heat generated by the heat generating component is transferred to coolant within the evaporative portion of the heat pipe to vaporize the coolant, and wherein the vaporized coolant is cooled within the condensation portion of the heat pipe and transfers the heat generated by the heat generating component to the frame casting.

6. The cooling system of claim 5, wherein the heat pipe comprises:
    a hollow core that contains the coolant; and
    a wicking layer surrounding the hollow core for transporting the vaporized coolant from the evaporative portion of the heat pipe to the condensation portion of the heat pipe.

7. The cooling system of claim 6, wherein the heat pipe further includes a thermal conductive layer surrounding the wicking layer for transferring at least a portion of the heat generated by the heat generating component to the frame casting and the heat spreader.

8. The cooling system of claim 7, wherein the heat generating component comprises a central processing unit (CPU), a graphical processing unit (GPU), or a chipset.

9. The cooling system of claim 4, further comprising a fin stack located at the vent in the frame casting, wherein the second portion of the heat pipe is also in thermal contact with the fin stack.

10. The cooling system of claim 4, wherein a top surface of the heat spreader includes a plurality of channels for increasing surface area and improving the heat transfer rate between the heat spreader and the air in the computer.

11. The cooling system of claim 10, wherein the plurality of channels are formed on the top surface of the heat spreader such that each channel points to a center of the radial fan to direct air flow in the computer to the radial fan.

12. The cooling system of claim 1, wherein a bottom surface of the heat spreader includes a thermal interface contact for each heat generating component in the computer to reduce thermal resistance between the heat spreader and each heat generating component.

13. The cooling system of claim 1, wherein the vent further includes a fin stack that is in thermal contact with the second portion of the heat pipe, and is cooled by the radial fan.

14. A method for cooling in a computer, the method comprising:

placing a heat spreader that is in thermal contact with a heat generating component in the computer;
providing a frame casting of the computer;
passively dissipating heat generated from the heat generating component with a heat pipe coupled to the computer to the frame casting, the heat pipe including,
   a first portion that is co-planar with and in direct contact with the heat generating component; and
   a second portion that is in thermal contact with the frame casting; and
cooling each of the heat pipe, the frame casting and the heat spreader with a radial fan by exhausting air from the computer through a vent in the frame casting, wherein the second portion of the heat pipe is disposed over the vent such that the air exhausted through the vent by the radial fan actively cools both the second portion of the heat pipe and the frame casting, and wherein a top surface of the heat spreader includes a plurality of channels pointing to a center of the radial fan to reduce resistance of air flow in the computer to the radial fan.

\* \* \* \* \*